United States Patent [19]

Song

[11] Patent Number: 5,642,310

[45] Date of Patent: Jun. 24, 1997

[54] SYSTEM AND METHOD FOR CONTROLLING SOURCE CURRENT AND VOLTAGE DURING FLASH MEMORY ERASE OPERATIONS

[75] Inventor: Paul Jei-zen Song, Sunnyvale, Calif.

[73] Assignee: Integrated Silicon Solution Inc., Santa Clara, Calif.

[21] Appl. No.: 596,432

[22] Filed: Feb. 2, 1996

[51] Int. Cl.$^6$ .................................................. G11C 7/00
[52] U.S. Cl. .............................. 365/185.29; 365/189.09; 365/185.27
[58] Field of Search .......................... 365/189.09, 218, 365/185.29, 185.27; 327/535, 536, 537, 538, 539; 323/314, 315, 316

[56] References Cited

U.S. PATENT DOCUMENTS

| 5,130,635 | 7/1992 | Kase | 327/535 |
|---|---|---|---|
| 5,253,201 | 10/1993 | Atsumi et al. | 365/189.09 |
| 5,265,059 | 11/1993 | Wells et al. | 365/204 |
| 5,267,213 | 11/1993 | Sung et al. | 365/226 |
| 5,295,113 | 3/1994 | Dix et al. | 365/228 |
| 5,359,552 | 10/1994 | Dhong et al. | 365/189.09 |
| 5,442,586 | 8/1995 | Javanifard et al. | 365/185.29 |

Primary Examiner—David C. Nelms
Assistant Examiner—Vu A. Le
Attorney, Agent, or Firm—Flehr Hohbach Test Albritton & Herbert LLP

[57] ABSTRACT

A double erase control circuit is disclosed for use with an EEPROM/flash memory system wherein each memory cell can be read, erased or programmed based, in part, on the voltage level of a word line coupled to the gate of each of the memory cells. A host selectively erases flash memory cells by placing 0 VDC on the word lines and a large positive voltage (10.4 VDC to 10.8 VDC) on an array virtual ground supply (VVSS) line while the drains of the memory cells float. The voltage and current on the VVSS line are simultaneously controlled using voltage and current control circuitry that are responsive to a high erase signal that is asserted by the host during an erase operation. When the erase signal is high, the voltage control circuitry uses a comparator, a stable reference voltage (1.28 VDC) derived from a band-gap reference and a feedback loop to maintain VVSS at the target source erase voltage (i.e., 10.4 VDC to 10.8 VDC). Simultaneously, the current control circuitry limits current on the VVSS line to approximately 10 mA through the use of a transistor that draws a known bias current and a current mirror that amplifies and mirrors the amplified bias current onto the VVSS line. When the host deasserts the erase signal, the double erase circuitry is disabled and VVSS is coupled to the circuit ground node.

18 Claims, 3 Drawing Sheets

SYSTEM AND METHOD FOR CONTROLLING SOURCE CURRENT AND VOLTAGE DURING FLASH MEMORY ERASE OPERATIONS

The present invention relates generally to semiconductor flash memory systems, and more specifically to on-chip control of flash cell source current and voltage during flash memory erase operations.

BACKGROUND OF THE INVENTION

Solid state and so-called flash memories are known in the art. An individual flash memory cell includes a metal-oxide-semiconductor ("MOS") device having spaced-apart drain and source regions fabricated on a substrate and defining a channel region therebetween. A very thin gate oxide layer overlies the channel region, and a floating charge-retaining storage gate overlies the channel region and is unconnected to the cell. A control gate at least partially overlies the floating gate and is insulated therefrom.

In practice, a plurality of such memory cells is arrayed in addressable rows and columns to form a flash memory array. Individual cells in the array are accessed for purposes of writing, reading or erasing data by decoding row and column information.

Typically, the control gates for a group of cells in a given row are formed from a continuous strip of conductive material that defines a so-called word line, abbreviated "WL". A word line might comprise, for example, a group of eight cells that collectively store one byte. For a given column in the array, the drain leads of all cells in the column are coupled to a so-called bit line, abbreviated "BL". The source leads of the various cells are collectively switchably coupled to one of several potential levels, depending upon whether cells in the array are to be programmed (written) or erased or are to be read.

Within the memory array, an individual cell is addressed and thus selected for reading, programming (writing) or erasing by specifying its row (or word line) as an x-axis coordinate, and its column (or bit line) as a y-axis coordinate. A 16 K-bit memory, for example, may comprise an array of 128×128 bits, in which there are 128 x-axis word lines and 128 y-axis bit lines. Commonly, blocks of memory cells are collectively grouped into sectors. Cell addressing is accomplished by coupling address bits to precoding x-decoders and to precoding y-decoders whose respective outputs are coupled to word lines and bit lines in the array.

Programming an addressed MOS memory cell occurs in a program mode by accelerating so-called hot electrons (from the device substrate). These electrons are injected from the drain region through the thin gate oxide and onto the floating gate. The control gate-source threshold voltage required before substantial MOS device drain-source current occurs is affected by the amount of such charge retained on the floating gate. Thus, storage cell programming forces the floating storage gate to retain charge that will cause the cell to indicate storage of either a logical "1" or "0" in a read-out mode.

The above-described storage cells are non-volatile in that the charge on the storage gate, and thus the "0" or "1" bit stored in the cell, remains even when control and operating voltages to the array are turned off. In the program (write) mode, the control gate is coupled to a high positive potential of perhaps +10 VDC, the drain is coupled to perhaps +6 VDC, and the source and substrate are grounded (meaning that they are coupled to the circuit ground node). This causes the hot electrons to be generated and captured by the floating gate.

In a read mode, the charge stored on the floating gate of an addressed MOS memory cell is read by coupling perhaps +5 VDC to the control gate, and reading drain-to-source current. The presence or absence of charge on the stored gate will define a binary "1" or "0" bit that is read-out from the addressed memory cell by a sense amplifier coupled to the bit line.

In an erase mode, the electrons trapped on the floating gates of a group of addressed MOS memory cells are encouraged to flow by electron tunneling to the source. During this erase mode, a group of word line decoders cause the addressed cells' control gates to be coupled to ground, or 0 VDC, the sources to be coupled to perhaps +11 VDC and the drains to float, with the substrates being coupled to ground. Note that in a flash memory configuration, entire sector-sized blocks of cells may be simultaneously erased, in a "flash".

In the various read, program or erase modes, the word lines (e.g., control gates) are set to the appropriate voltage levels by x-decoder circuitry. One portion of such circuitry, a positive-voltage word line decoder, pulls selected word lines up to VCC during normal read mode and to the larger positive potential (e.g., +10 VDC) during programming mode, and grounds unselected word line sectors.

As mentioned above, when a memory cell is being erased, its control gate is tied to 0 VDC, its drain floats and its source is tied to a large positive voltage. The 0 VDC control gate voltage and large positive source voltage encourage the charge accumulated on the gate to flow into the source as a source current. If this source current is excessive, band to band tunneling could result, causing snap back and other adverse effects. If the source current is inadequate, the cell will not be completely erased. Consequently it is vital that, during an erase operation, the source current (and the source voltage, which causes the source current to flow) be maintained at the appropriate levels.

Prior art flash memory systems do not provide circuitry for reliably controlling flash cell source voltage or current during erase operations. Instead, the large positive source voltage is generated from an external, high voltage power supply (hereinafter called VPPESD), which can be highly variable (e.g., VPPESD can vary between 11.4 and 12.6 VDC). Due to the variability in VPPESD, during erase operations the large positive source voltage and source current are likely to vary and cause at least some of the adverse effects mentioned above. Moreover, because prior art memories lack current control circuitry, even if VPPESD happens to remain stable at the correct level for the duration of an erase operation, excessive power supply current could interfere with the programming of memory cells which are not to be erased.

Consequently, there is a need for on-chip control for controlling source current and voltage when a flash memory is being erased. In accordance with the present invention, this control circuitry could make use of stable reference voltage, such as a band-gap reference voltage, and a feedback control system to set the source voltage at the correct level. There is also a need for on-chip circuitry that ensures that the source voltage power supply does not provide excessive current that might interfere with cell programming.

SUMMARY OF THE INVENTION

The present invention is a double erase control circuit for use in a EPROM/flash memory array that includes a plurality of memory cells that can be programmed, erased and read by a host device.

More specifically, the double erase control circuit of the present invention includes a comparator, a feedback network and a voltage divider network that cooperate during an erase operation to maintain the voltage supplied to the source of a memory at a target source voltage. The comparator has a first differential input that is coupled to a stable voltage reference and a second differential input that is coupled to a first circuit node, the comparator being configured to change its output as a function of differences between the voltage reference and a voltage at the first node. The feedback network has an input coupled to the comparator's output and is configured to respond to changes in the comparator's output by driving a second node towards the target source erase voltage when the reference voltage and the voltage at the first node differ. As long as an erase operation on at least a subset of the memory cells is in progress, the voltage divider network maintains the second circuit node at the target source erase voltage when the voltage at the first node is equal to the voltage reference. The second node is coupled to sources of the subset of memory cells, so that, when the erase operation is in progress, charge stored on respective floating gates of the subset flows into the sources, thereby erasing the memory cells.

In a preferred embodiment of the present invention, the voltage reference is derived from a band-gap reference, which allows the voltage reference to be maintained at a stable +1.28 VDC. The target source erase voltage is between +10.4 and +10.8 VDC.

In the preferred embodiment, the feedback network includes a voltage control branch configured to drive the voltage at the second node towards the target source erase voltage and a current control branch configured to maintain current flowing into the second node at a predetermined target source erase current. The current control branch and the voltage control branch are interconnected so that the erase source current and erase source voltage are simultaneously controllable using the feedback network.

Other features and advantages of the invention will appear from the following description in which the preferred embodiments have been set forth in detail in conjunction with the accompanying drawings.

DESCRIPTION OF THE PREFERRED EMBODIMENT

Figure 1:
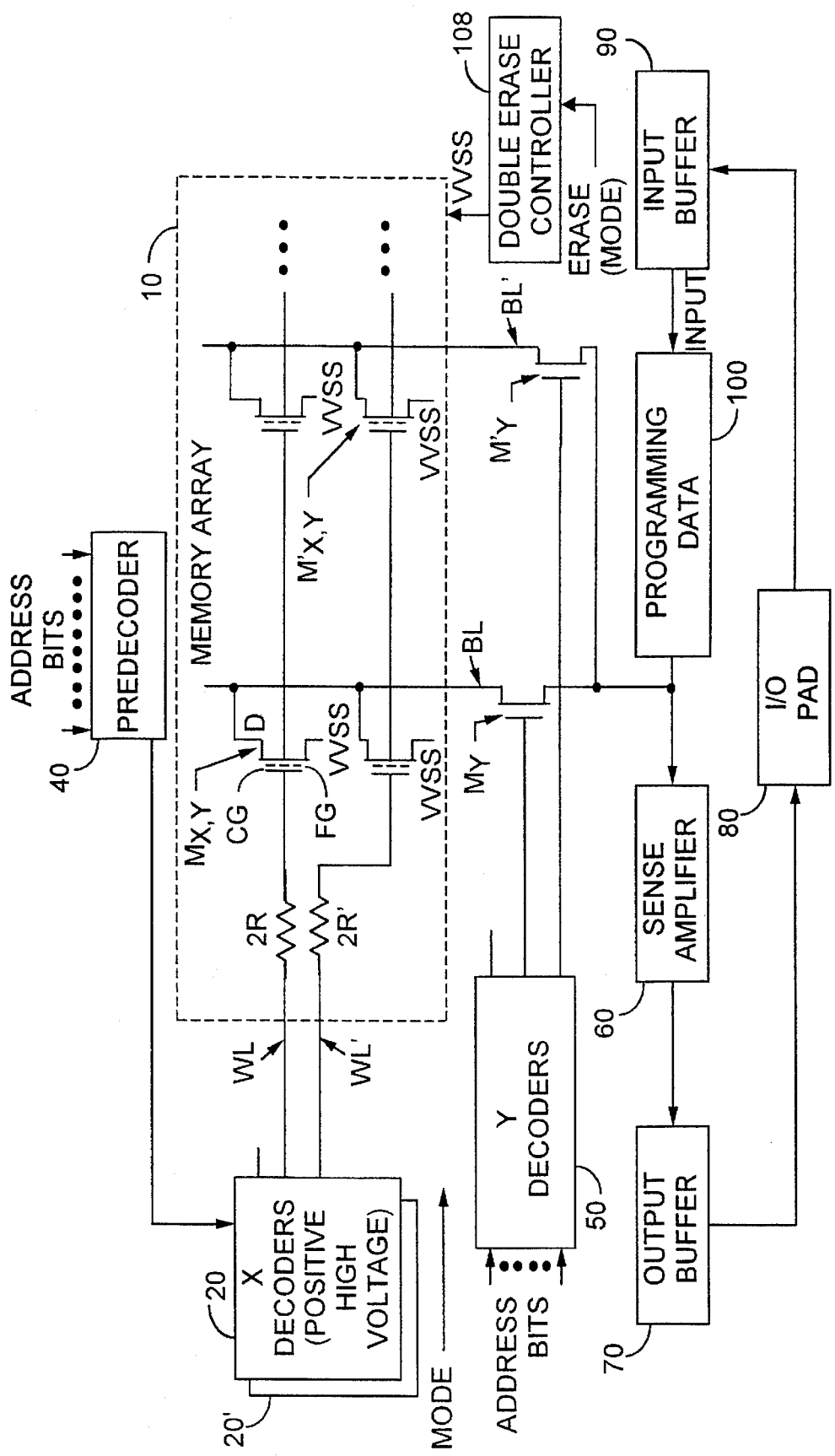
FIG. 1 is a block diagram of an EPROM/flash memory system with which the present invention may be practiced.

FIG. 1 is a block diagram of EPROM or flash memory cell architecture with which the present invention may be practiced. A memory array 10 includes a plurality of MOS memory cells such as cells $M_{x,y}$, and $M'_{x,y}$, each cell having source and drain regions, a floating gate (denoted FG) and a control gate (denoted CG). A plurality of such cells in a given horizontal (or x-axis) row have their control gates coupled together to form a word line (WL).

Each word line is selectively pulled-up or pulled-down to a program, read or erase voltage level by an x-axis positive high-voltage decoder. Two word lines are shown in FIG. 1, WL being pulled-up by decoder 20 and word line WL' being pulled-up by decoder 20'. To minimize high voltage switching transients, each word line preferably includes an associated series resistance 2R of a few K$\Omega$.

Although only two word lines are shown in FIG. 1, array 10 will include many word lines. In practice, it is common to treat groups of eight word lines as a common block, in which case there will be eight associated positive high voltage x-decoders.

A predecoder 40 receives input address information from a host device such as a microprocessor computing system (not shown) and outputs appropriate signals to the decoders 20. In turn, the appropriate decoders will pull an associated word line up to a necessary voltage level.

More specifically, a positive high voltage x-decoder 20 pulls a selected word line WL in memory array 10 up to about +10 VDC in program/write mode, and up to VCC (e.g., approx. +5 VDC) in read mode. In erase mode, the word lines WL are maintained by the positive high voltage x-decoder at 0 VDC, or ground, while the double erase controller 108 sets the virtual ground node VVSS to either a positive high voltage between +10.4 VDC and +10.8 VDC or to 0 VDC, depending on whether a set of flash cells is to be erased or programmed/read, respectively. Based upon the respective potentials to which the selected word line WL is set by decoder 20 and the VVSS node is set by the double erase controller 108, information in the cell $M_{x,y}$ may be read out, erased, or programmed.

A y-decoder 50 also receives address information from the host device. In conventional fashion, a plurality of cells in a column in the array have their source regions coupled together to form a bit line (BL). The output from the y-decoder 50 turns-on a y-axis select transistor, e.g., $M_y$, which couples the bit line signal to the input of a sense amplifier 60 that reads the stored bit of information in the address-selected cell $M_{x,y}$. If, instead, cell $M'_{x,y}$ is to be read, the y-decoder 50 will turn on the select transistor $M'_y$. For ease of illustration, only two bit lines, BL and BL', are depicted in FIG. 1 although in practice array 10 will include a great many bit lines.

In a read mode of operation, the sense amplifier output is coupled through an output buffer 70. The "0" or "1" signal stored in an addressed cell $M_{x,y}$ is then provided to an input/output pad 80, from where the information may be accessed by the host device.

Data to be stored within the array 10 is coupled to the input/output pad 80 by the host device, from where the data are coupled to an input buffer 90. The output of buffer 90 is provided to an interface 100 that provides suitable programming data for the array. The system shown in FIG. 1 also receives from the host device signals commanding either a program/write mode, erase mode, or a read mode.

As mentioned above, the sources of the memory cells are tied to a circuit virtual ground node (VVSS) that is maintained by the double erase controller 108 at a voltage level appropriate to the memory's current mode of operation. During read and program operations, the virtual ground node is maintained at true ground, or zero volts. During erase operations, the virtual ground node is maintained at a stable, large positive voltage (between +10.4 and +10.8 VDC) to encourage the electrons stored on the floating gate of flash cell being erased to tunnel to the source. These two virtual ground voltages (i.e., true ground and large positive voltage) are provided by the double erase control circuit 108 in response to the status of an ERASE signal from the host, which is not shown in FIG. 1. When the ERASE signal is high, signifying that an erase operation is underway, the double erase control circuit 108 sets the voltage at the VVSS node to a target erase source voltage (i.e., +10.4 to 10.8 VDC). Conversely, when the ERASE signal is low, the double erase control circuit 108 grounds the VVSS node (meaning it couples the VVSS node to a true circuit ground node).

Figure 2:
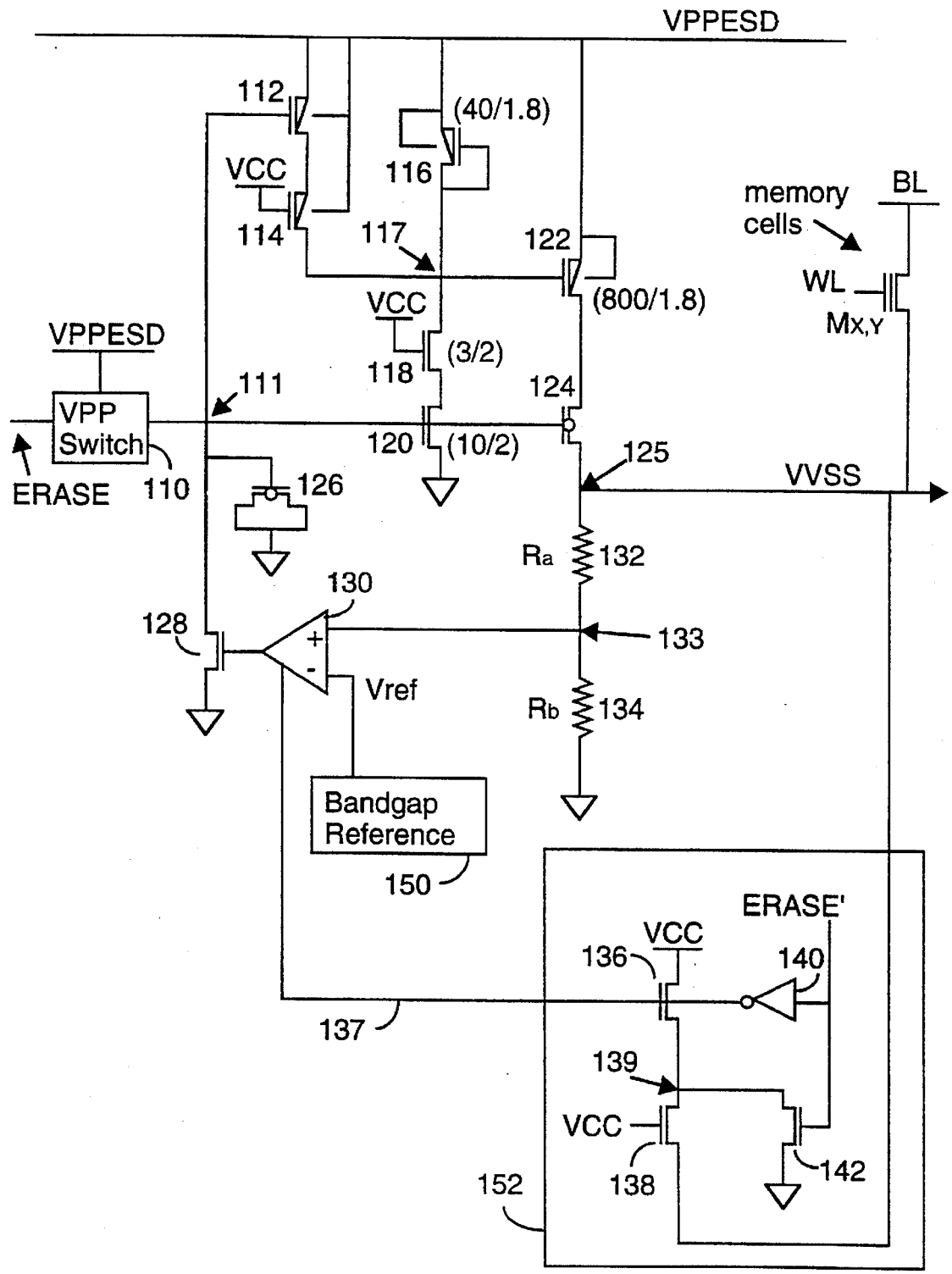
FIG. 2 is a block diagram of the double erase control circuitry of the present invention.

Using a voltage regulation system described in reference to FIG. 2, the double erase control circuit 108 maintains VVSS at the target erase source voltage during erase operations despite variations in the external power supply voltage (VPPESD) that drives the double erase controller 108. The stability in VVSS provided by the present invention prevents excessive memory cell source current during erases and the concomitant risks of band-to-band tunneling and snap back. In addition to providing voltage control at the VVSS node, the double erase control circuitry 108 also roughly limits the current at the VVSS node to avoid disturbing the programming of cells which are not to be erased. For example, in the preferred embodiment, the current at the VVSS node is limited to approximately 10 mA.

Note that, while FIG. 1 shows a single double erase circuit 108, in practice a double erase circuit 108 is provided for each sector of a large memory. Details of the double erase control circuitry are now described in reference to FIG. 2.

The double erase controller 108 includes a VPP, or pumping, switch 110; p-channel transistors 112, 114, 116, 122; n-channel transistors 118, 120, 128, 136, 138, 142; a native n-channel transistor 124; an inverter 140; a band-gap reference 150; a comparator 130; a MOS capacitor 126; and resistors 132, 134. FIG. 2 also shows a representative memory cell $M_{x,y}$, which is not a part of controller 108, the source of which is coupled to the VVSS node. External power inputs to the double erase controller 108 include VCC (approx. +5 VDC), VPPESD (external power supply, approx. 10–12 VDC) and $v_{ref}$ (derived from the band gap reference 232 and equaling +1.28 VDC). Control signals from the host include ERASE (a signal that enables the erase circuitry) and its complement, ERASE'.

The erase control circuitry 108 provides voltage and current regulation at the VVSS node 125 only when the ERASE signal is high (i.e., at 5 VDC). When the ERASE signal is low (i.e., at 0 VDC) the erase control circuitry is disabled through the combined actions of the comparator control circuit 152, which includes the transistors 136, 138, 142 and the inverter 140, and the VPP switch 110, the operations of which are now described.

The VPP switch 110 generates a high output at the level of its power supply (i.e., VPPESD) whenever its input (i.e., ERASE) is high. The output of the VPP switch 110 is coupled to a node 111, the voltage at which ($V_{111}$) is determined partly by the output signal from the VPP switch and partly by the operation of other elements of the erase control circuit 108, such as the capacitor 126 and the pulldown transistor 128. For example, when ERASE is high, $V_{111}$ can be pulled lower than VPPESD by the pulldown transistor 128. The node 111 is also coupled to the gates of the n-channel transistors 120, 124 and the p-channel transistor 112. Consequently, when ERASE and $V_{111}$ are high, the transistors 120, 124 are turned on and the transistor 112 is turned off. The opposite is true when ERASE is low. Additional details of the VPP switch 110 are described below, in reference to FIG. 3.

The comparator control circuit 152 is driven by an input (ERASE') that is the complement of the ERASE signal and has outputs coupled to the VVSS node 125 and the positive power supply terminal 137 of the comparator 130. When the ERASE' signal is high (meaning that the memory is not in erase mode), the comparator control circuitry 152 disables the comparator 130 by cutting off power to the controller power terminal 137 and also pulls the VVSS node 125 down to true circuit ground. When ERASE' is high, the comparator control circuitry 152 enables the comparator 130 by providing a high output to the controller power terminal 137, allowing the comparator 130 to control the voltage and current at the VVSS node. How this accomplished by the comparator control circuit is now described.

The ERASE' signal is coupled to the input of the inverter 140, whose output is tied to the gate of the n-channel transistor and the positive power supply input 137 of the comparator 130. The ERASE' signal is also coupled to the gate of the transistor 142, whose drain is tied to the source and drain of the n-channel transistors 136 and 138, respectively. When the ERASE' signal is low (which is the case throughout an erase operation), the inverter 140 maintains a high signal (VCC) on the line 137, which keeps the comparator 130 in a powered-up condition. At the same time, the transistor 142 is turned-off, causing its drain to float, which prevents VVSS from being pulled down to ground through the transistor 138. This allows the remainder of the erase control circuitry 108 to set VVSS by controlling the voltage and current at the node 125. Conversely, when the ERASE' signal is high, the comparator 130 is powered down and the transistor 142 turned on. In this situation, VVSS is pulled down to the true circuit ground.

Having described how the different ERASE signal values determine the mode of operation of the erase control circuitry 108 and the level (high vs. low) of VVSS, the means by which the circuitry 108 regulates the voltage and current at the node 125 (when the ERASE signal is high) will now be described.

Voltage control at the node 125 is provided by the comparator 130, the n-channel transistor 128, the native transistor 124, the band-gap reference 150 and the resistors 132, 134. As long as the ERASE signal is asserted, the double erase controller 108 is required to maintain the VVSS node 125 between approximately 10.4 and 10.8 VDC, which is the target array virtual ground level for erase operations. This is accomplished primarily through the comparator 130, one input of which is coupled to the reference voltage (Vref, 1.28 VDC) derived from the band-gap reference 150, the other input of which is coupled to the output node 133 ($V_{133}$) of the voltage divider network that consists of the resistors 132 and 134. Given this configuration, it should be apparent to one skilled in the art that the voltage at the node 133 is given by equation (1), wherein "Ra" and "Rb" denote the resistance of the resistors 132 and 134, respectively.

$$VVSS = V_{133}\frac{R_a+R_b}{R_b} \quad (1)$$
$$= V_{ref}\frac{R_a+R_b}{R_b}$$

Using equation (1), the resistor values $R_a$ and $R_b$ are selected so that, when VVSS is between 10.4 and 10.8 VDC (the target source erase voltage), $V_{133}$ will be at 1.28 VDC (i.e., Vref). For example, in the preferred embodiment, $R_a$ is between 14R and 14.5R and $R_b$ is 2R, where "R" represents the resistance provided by a five square N-well resistor, which is approximately 5 kΩ. With appropriate values for $R_a$ and $R_b$, when VVSS deviates from its target range, $V_{133}$ will also vary from Vref. As a result of this variation at one of its inputs, the comparator's output will vary, which variation is used by the feedback elements, including the pulldown transistor 128, the native transistor 124 and the resistors 132, 134, to drive $V_{133}$ towards $V_{ref}$ and, by extension, VVSS towards its target level (i.e. between 10.4 and 10.8 VDC depending on the relative values of $R_a$ and $R_b$).

For example, when $V_{133}$ is more positive than Vref, the comparator 130 generates a higher output to the gate of the transistor 128, which as a result tends to pull down the node 111 more strongly. This provides less drive to the native transistor 124 and VVSS falls. Conversely, when $V_{133}$ is less positive than Vref, the comparator 130 generates a lower output at the gate of the transistor 128, which turns on less strongly, allowing the voltage at the node 111 to rise. This causes the native transistor 124 to turn on more strongly, pulling up VVSS. In this way, the controller 110 is able to maintain VVSS in its target range when the memory is in erase mode.

Additional voltage control at the VVSS node 125 is provided by the MOS capacitor 126, which in the preferred embodiment has an area of approximately $10000 \times 8.4 \ \mu m^2$, or a capacitance of approximately 180 pF. The capacitor 126 charges and discharges as the voltage at the node 11 changes, thereby smoothing out variations in the voltage on the gate of the native transistor 124 and VVSS.

As mentioned above, the double erase controller 108 also controls the current at the VVSS node 125 during erase operations. Current control is provided by the p-channel transistors 116 and 122, which form a current mirror, and the n-channel transistors 118 and 120, which generate a bias current that is multiplied by the current mirror. As mentioned above, the node 111 is coupled to the gate of the n-channel transistor 111, whose source is tied to the circuit ground node and whose drain is coupled to the source of the n-channel transistor 118. When $V_{111}$ is high, which is the case whenever ERASE is high, the n-channel transistor 120 turns on, causing its drain, and the source of the transistor 118 to be pulled down towards ground. Because the gate of the n-channel transistor 118 is always tied to VCC, this also causes the node 117, which is tied to the drain of the transistor 118, to be pulled down towards ground. The transistor 118 is fabricated with a preset width/length ratio (3/2) so that, under these conditions, the transistor 118 draws a known bias current (~5 mA) whenever the transistor 120 is turned on (i.e., whenever ERASE is high).

The gates of the two p-channel transistors 116, 122 composing the current mirror are coupled to the node 117 and their sources are coupled to the external power signal VPPESD (11 to 12 VDC). Consequently, these transistors 116, 122 are tuned on when the node 117 is pulled down by the two transistors 118 and 120. The transistors 116 and 122 have identical channel lengths, but the width of the transistor 122 is a predetermined multiple (K) of the width of the transistor 116; this configuration allows the transistor 122 to provide a drain current that is K times the drain current of the transistor 116. In the preferred embodiment, the width/length ratios of the transistors 116 and 122 are 40 and 800, respectively, providing a current multiple (K) of 20. Because the width of the bias transistor is far smaller than the widths of the p-channel transistor 116, the current provided by the p-channel transistor 116 is limited to the level of the bias current (0.5 mA) whenever erase operations are underway. As a result, the current mirror provides a current at the VVSS node that is approximately 10 mA (i.e., 20×the bias current).

Note that when ERASE and $V_{111}$ are low, the p-channel transistors 112 and 114 are turned on, which causes the node 117 to be pulled high (towards VPPESD). As a result, the p-channel transistors 116 and 122 that compose the current mirror are turned off and no current is provided at the VVSS node. Thus, in the preferred embodiment, neither current nor voltage control is provided at the VVSS node 125 when ERASE is low.

The preceding description shows how the present invention provides a stable VVSS signal between 10.4 VDC and 10.8 VDC while simultaneously limiting the current at which VVSS is provided to approximately 10 mA. Of course, the voltage and control circuitry of the present invention could be used separately to provide voltage control or current control at the VVSS node 125.

Figure 3:
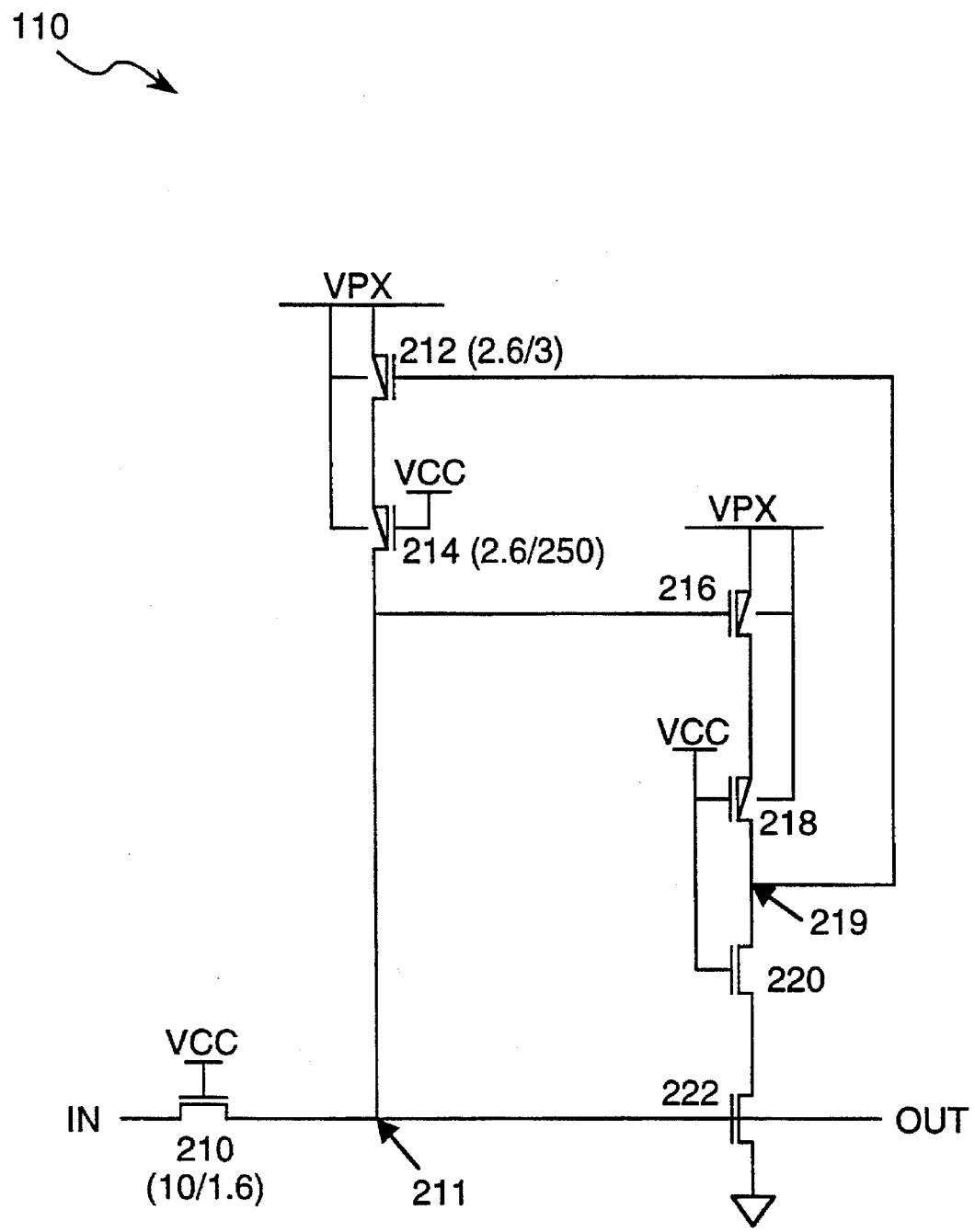
FIG. 3 is a block diagram of the switch 110 shown in FIG. 2.

Having completed the description of the double erase controller 108, additional details of the VPP switch 110, which provides the high voltage signal at the node 111 are now provided. Referring to FIG. 3, a circuit diagram is shown of the VPP switch 110. This circuit consists of three n-channel transistors 210, 220 and 222 and four p-channel transistors 212, 214, 216, and 218. The VPP switch 110 receives an input (IN) that is between 0 volts and VCC (~5 VDC), is powered by a power supply (VPX) that exceeds VCC and generates an output signal OUT. In the preferred embodiment, the IN, OUT and VPX signals correspond, respectively, to ERASE, $V_{111}$ and VPPESD; and VPPESD is between 11 VDC and 12 VDC.

The input signal (IN) is coupled to the drain of the transistor 210, the gate of which is coupled to VCC, meaning that input signals IN are mirrored at the node 211, at the source of the transistor 210. Node 211 is also tied to the gates of the n-channel transistor 222 and the p-channel transistor 216; to the drain of the p-channel transistor 214; and to the output OUT. Consequently, when the voltage at the node 211 is high, the transistor 222 turns on and the transistor 216 turns off.

When its gate goes high, the transistor 222 turns on and pulls its drain and the source of the transistor 220 down to ground. Because its gate is tied to VCC, the transistor 220 is turned on, so it passes the low voltage through to the node 219. Note that the voltage level at the node 219 is not affected by the p-transistors 218 and 216 when the input is high because, even though the transistor 218 is able to conduct (its body is biased to VPX, or 11–12 VDC, and its gate is tied to VCC, or ~5 VDC), the transistor 216 is off because its gate is tied to the high signal at the node 211. The node 219 is coupled to the gate of the p-channel transistor 212, which strongly turns on in response to the low voltage at that node, driving its drain and the source of the transistor 214 to VPX. As the gate and body of the transistor 214 are back-biased (the gate being at a substantially lower voltage, VCC, than that of the body, VPX), the transistor 224 turns on and tries to pull up the node 211 to VPX from approximately VCC, which is the voltage output by the transistor 210.

The transistor 214 is configured so that it has a much lower channel resistance than the pass transistor 210 and therefore is easily able to pull-up the node 211 and the output OUT to an output voltage level that is very close to VPX. For example, in the preferred embodiment, the pass transistor 210 has a width/length (W/L) ratio of 10/1.6, whereas the pull-up transistor 214 has a W/L ratio of 2.6/250. It should be apparent to one skilled in the art that, once the node 211 is pulled up to $VCC-V_T$, where $V_T$ is the threshold voltage of the transistor 210, the transistor 210 will turn off and have no impact on the voltage level at the node 211.

Conversely, when IN goes low (i.e., to 0 VDC), the voltages at the node 111 and the output OUT fall and the transistor 210 turns off. In response to the low voltage at the node 211, the transistors 216 and 218 turn on and pull the node 219 up to VPX, which causes the transistors 212 and 214 to turn off, allowing the voltage at the node 211 to remain low. As a result, as long as IN is low, the VPP switch 110 outputs a low OUT signal.

In the preferred embodiment, to facilitate circuit layout, the transistors 212, 214 are matched in size and type to the transistors 216, 218. However, it is not necessary to the circuit's functionality that these transistors be matched. In an alternative embodiment, the width/length ration of the transistor 214 can be selected to reduce high-voltage switching transients in the VPP switch.

Modifications and variations may be made to the disclosed embodiments without departing from the subject and spirit of the invention as defined by the following claims.

What is claimed is:

1. A double erase control circuit for use in an EPROM/flash memory array that includes a plurality of memory cells that can be programmed, erased and read by a host device, said double erase control circuit comprising:

a comparator having a first differential input that is coupled to a stable voltage reference and a second differential input that is coupled to a first circuit node; said comparator changing its output as a function of differences between said voltage reference and a voltage at said first node; and a feedback network having an input coupled to said comparator's output, said feedback network being configured to respond to changes in said comparator's output by driving a voltage at a second circuit node towards a target source erase voltage when said voltage reference and said voltage at said first node differ;

said feedback network including a voltage divider network that, as long as an erase operation on at least a subset of said memory cells is in progress, maintains said second circuit node at said target source erase voltage when said voltage at said first node is equal to said voltage reference, said second node being coupled to source terminals of said subset of memory cells, so that, when said erase operation is in progress, charge stored on respective floating gates of said subset flows into said source terminals, thereby erasing said cells;

wherein said voltage reference is derived from a band-gap reference and said voltage reference is approximately +1.28 VDC.

2. The double erase control circuit of claim 1, wherein said target source erase voltage is between +10.4 and +10.8 VDC.

3. A double erase control circuit for use in an EPROM/flash memory array that includes a plurality of memory cells that can be programmed, erased and read by a host device, said double erase control circuit comprising:

a comparator having a first differential input that is coupled to a stable voltage reference and a second differential input that is coupled to a first circuit node; said comparator changing its output as a function of differences between said voltage reference and a voltage at said first node; and a feedback network having an input coupled to said comparator's output, said feedback network being configured to respond to changes in said comparator's output by driving a voltage at a second circuit node towards a target source erase voltage when said voltage reference and said voltage at said first node differ;

said feedback network including:

a voltage divider network that, as long as an erase operation on at least a subset of said memory cells is in progress, maintains said second circuit node at said target source erase voltage when said voltage at said first node is equal to said voltage reference, said second node being coupled to source terminals of said subset of memory cells, so that, when said erase operation is in progress, charge stored on respective floating gates of said subset flows into said source terminals, thereby erasing said cells;

a voltage control branch configured to drive said voltage at said second node towards said target source erase voltage; and a current control branch configured to maintain current flowing into said second node at a predetermined target source erase current; said current control branch being coupled with said voltage control branch so that said erase source current and erase source voltage are simultaneously controllable using said feedback network.

4. The erase/program verify voltage control circuit of claim 3, wherein said comparator is configured to drive its output higher when said voltage at said first node is greater than said voltage reference and to drive said output lower when said first node voltage is smaller than said voltage reference.

5. The double erase control circuit of claim 4, wherein said voltage control branch comprises:

a first n-channel transistor having a gate, source and drain coupled respectively to said comparator output, to a circuit ground node and to a third node, the voltage at said third node being determined by a positive, high voltage erase signal that is always high during an erase operation; and a native transistor having a gate, drain and source coupled respectively to said third node, said current control branch and said second node; such that, when said comparator output is driven to a higher level, said first n-channel transistor turns on more strongly, pulling down said voltage at said third node and causing said native transistor to turn on less strongly, as a result of which less current flows through said voltage divider network, decreasing voltage levels at said first and second nodes.

6. The double erase control circuit of claim 5, wherein said current control branch comprises:

a second n-channel transistor having a gate, source and drain coupled respectively to said third node, said circuit ground node and the source of an n-channel bias transistor, so that said second transistor connects said source of said bias transistor to said circuit ground node during said erase operation;

said n-channel bias transistor having a drain coupled to a fourth node and a gate coupled to a circuit VCC node so that said bias transistor connects said fourth node to said circuit ground node during said erase operation, said bias transistor being configured so that said bias transistor draws a known bias current when said bias transistor and said second n-channel transistor are connected to said circuit ground node during said erase operation; and a current mirror that includes:

a first p-channel transistor fabricated with a first device width and a first channel length, said first p-channel transistor having a drain and a gate coupled to said fourth node and a source coupled to a VPPESD circuit node, so that, when said erase operation is underway, said first p-channel transistor turns on with a drain current equaling said bias current; and a second p-channel transistor fabricated with a second device width and said first channel length, said second device width being a predetermined multiple of said first channel width, said second p-channel transistor having a gate, source and drain coupled respectively to said fourth node, said VPPESD circuit node, and the drain of said native transistor;

such that, when said erase operation is underway, said second p-channel transistor draws a drain current that is larger than said bias current by said predetermined multiple, said drain current comprising said target source erase current.

7. The double erase control circuit of claim 6, wherein said predetermined multiple is 20 times.

8. The double erase control circuit of claim 7, wherein said bias current is approximately 0.5 mA and said target source erase current is approximately 10 mA.

9. A double erase control circuit for use in an EPROM/flash memory array that includes a plurality of memory cells that can be programmed, erased and read by a host device, said double erase control circuit comprising:

a comparator having a first differential input that is coupled to a stable voltage reference and a second differential input that is coupled to a first circuit node; said comparator changing its output as a function of differences between said voltage reference and a voltage at said first node;

a feedback network having an input coupled to said comparator's output, said feedback network being configured to respond to changes in said comparator's output by driving a voltage at a second circuit node towards a target source erase voltage when said voltage reference and said voltage at said first node differ;

said feedback network including a voltage divider network that, as long as an erase operation on at least a subset of said memory cells is in progress, maintains said second circuit node at said target source erase voltage when said voltage at said first node is equal to said voltage reference, said second node being coupled to source terminals of said subset of memory cells, so that, when said erase operation is in progress, charge stored on respective floating gates of said subset flows into said source terminals, thereby erasing said cells; and a comparator control circuit having an input coupled to an erase complement signal, ERASE', that is de-asserted by said host when said erase operation is in progress and outputs coupled respectively to said second node and a high power input of said comparator, said comparator control circuit being configured to:

when said ERASE' signal is low, provide power to said comparator, enabling normal operation of said comparator so that said comparator can provide voltage control at said second node; and when said ERASE' signal is high, remove power from said comparator, rendering said comparator inoperative so that said comparator cannot provide voltage control at said second node and pull said second node down to said circuit ground node.

10. The double erase control circuit of claim 5, further comprising:

a pumping switch powered by an external high voltage power supply, said switch receiving a boolean input with low and high values respectively at 0 volts and VCC level and generating a boolean output with low and high values respectively at 0 volts and the level of said external high voltage power supply (VPX), said switch generating said high and low outputs in response to said high and low inputs, respectively, wherein said switch input is coupled to an erase signal asserted by said host when said erase operation is in progress and said switch output is coupled to said third node.

11. The double erase control circuit of claim 10, wherein said switch comprises:

a first n-channel switch transistor whose gate, drain and source are coupled respectively to VCC, said erase signal and a first switch node;

a second n-channel switch transistor whose gate, drain and source are coupled respectively to said first switch node, said circuit ground node and the source of a third n-channel switch transistor;

said third n-channel transistor having a gate and a drain coupled respectively to VCC and a second switch node;

a first p-channel switch transistor whose gate, source, drain and body are coupled respectively to said second switch node, VPX, the source of a second p-channel switch transistor and VPX;

said second p-channel switch transistor having a gate, drain and body coupled respectively to VCC, said first node and VPX; and a third p-channel switch transistor whose gate, source, drain and body are coupled respectively to said first node, VPX, the source of a fourth p-channel switch transistor and VPX;

said fourth p-channel switch transistor having a gate, drain and body coupled to VCC, said second switch node and VPX;

such that, when said erase signal is high, said first node is pulled up by said first and second p-channel transistors to VPX and, when said erase signal is low, said first and second p-channel are turned off and said first node remains low.

12. The double erase control circuit of claim 11, wherein said first and second p-channel switch transistors are MOS transistors fabricated respectively with the same length and width as said third and fourth transistors, which are also MOS transistors.

13. The double erase control circuit of claim 12, wherein first and third p-channel transistors have a length/width ratio of 2.6/3 and wherein said second and fourth p-channel transistors have a length/width ratio of 2.6/250.

14. A double erase control circuit for use in an EPROM/flash memory array that includes a plurality of memory cells that can be programmed, erased and read by a host device, said double erase control circuit comprising:

a pumping switch powered by an external high voltage power supply, said switch receiving a boolean input with low and high values respectively at 0 volts and VCC level and generating a boolean output with low and high values respectively at 0 volts and the level of said external high voltage power supply (VPX), said switch generating said high and low outputs in response to said high and low inputs, respectively, said switch input being coupled to said erase signal asserted by said host;

a comparator having a first differential input that is coupled to a stable voltage reference and a second differential input that is coupled to a first circuit node and a power supply coupled to said switch output; said comparator being configured to change its output as a function of differences between said voltage reference and a voltage at said first node only when said switch output is high; and a feedback network having a first input coupled to said comparator's output and a second input coupled to said switch output, said feedback network being configured to respond to changes in said comparator's output by driving a voltage at a second circuit node towards a target source erase voltage when said voltage reference and said voltage at said first node differ only when said switch output is high;

said feedback network including a voltage divider network that, as long as an erase operation on at least a subset of said memory cells is in progress, maintains said second circuit node at said target source erase voltage when said voltage at said first node is equal to said voltage reference, said second node being coupled to source terminals of said subset of memory cells, so that, when said erase operation is in progress, charge stored on respective floating gates of said subset flows into said source terminals, thereby erasing said cells.

15. The double erase control circuit of claim 14, wherein said voltage reference is derived from a band-gap reference.

16. The double erase control circuit of claim 15, wherein said voltage reference is approximately +1.28 VDC.

17. The double erase control circuit of claim 14, wherein said target source erase voltage is between +10.4 and +10.8 VDC.

18. The double erase control circuit of claim 14, wherein said switch comprises:

a first n-channel switch transistor whose gate, drain and source are coupled respectively to VCC, said erase signal and a first switch node;

a second n-channel switch transistor whose gate, drain and source are coupled respectively to said first switch node, said circuit ground node and the source of a third n-channel switch transistor;

said third n-channel transistor having a gate and a drain coupled respectively to VCC and a second switch node;

a first p-channel switch transistor whose gate, source, drain and body are coupled respectively to said second switch node, VPX, the source of a second p-channel switch transistor and VPX;

said second p-channel switch transistor having a gate, drain and body coupled respectively to VCC, said first node and VPX; and a third p-channel switch transistor whose gate, source, drain and body are coupled respectively to said first node, VPX, the source of a fourth p-channel switch transistor and VPX;

said fourth p-channel switch transistor having a gate, drain and body coupled to VCC, said second switch node and VPX;

such that, when said erase signal is high, said first node is pulled up by said first and second p-channel transistors to VPX and, when said erase signal is low, said first and second p-channel are turned off and said first node remains low.

* * * * *